United States Patent
Tamura et al.

(10) Patent No.: US 6,815,352 B1
(45) Date of Patent: Nov. 9, 2004

(54) SILICON FOCUS RING AND METHOD FOR PRODUCING THE SAME

(75) Inventors: Kazuyoshi Tamura, Annaka (JP); Makoto Kawai, Annaka (JP); Keiichi Goto, Annaka (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 0 days.

(21) Appl. No.: 09/696,955

(22) Filed: Oct. 27, 2000

(30) Foreign Application Priority Data

Nov. 9, 1999 (JP) ............................................. 11-317962

(51) Int. Cl.[7] .......................................... H01L 21/302
(52) U.S. Cl. ................................. 438/691; 156/345.51
(58) Field of Search ..................... 117/12, 13; 156/345, 156/345.51; 118/723 MA, 723 R; 204/298.16

(56) References Cited

U.S. PATENT DOCUMENTS 6,190,495 B1 * 2/2001 Kubota et al. .............. 156/345
6,284,093 B1 * 9/2001 Ke et al. .................... 156/345
6,299,982 B1 * 10/2001 Tamatsuka et al. ......... 428/446

FOREIGN PATENT DOCUMENTS

JP  A 05-114583  5/1993
JP  A 09-283495  10/1997
JP  A 11-092283  4/1999

OTHER PUBLICATIONS

Wolf et al., Silicon Processing for the VLSI Era, vol. 1: rocess Technology, Lattice Press, Sunset Beach, CA, USA, pp. 8, 23–27, 32–33, 59, 1986.*
Wolf et al., Silicon Processing for the VLSI Era, vol. 1: Process Technology, Lattice Press, Sunset Beach, CA, USA, pp. 8–, 23—27, 32–33, 59, 529–532, 1986.*
"Nitrogen effect on oxygen precipitation in Czochralski silicon", F. Shimura and R.S. Hockett, 1986 American Institute of Physics, Appl. Phys. Lett. 48 (3), Jan. 20, 1986, pp. 224–226.

* cited by examiner

Primary Examiner—Nadine G. Norton
Assistant Examiner—Matthew Anderson
(74) Attorney, Agent, or Firm—Oliff & Berridge, PLC

(57) ABSTRACT

There is disclosed a silicon focus ring consisting of silicon single crystal used as a silicon focus ring in a plasma apparatus, wherein concentration of interstitial oxygen contained in the silicon focus ring is not less than $5\times10^{17}$ atoms/cm$^3$ and not more than $1.5\times10^{18}$ atoms/cm$^3$, and a producing method for a silicon focus ring used for a plasma apparatus, wherein a single crystal silicon wherein concentration of interstitial oxygen contained in the silicon focus ring is not less than $5\times10^{17}$ atoms/cm$^3$ and not more than $1.5\times10^{18}$ atoms/cm$^3$ is grown by a Czochralski method, the single crystal silicon is processed in a circle, and a silicon focus ring is produced. There can be provided a silicon focus ring, which can prevent disadvantage due to impurities such as heavy metal.

2 Claims, 1 Drawing Sheet

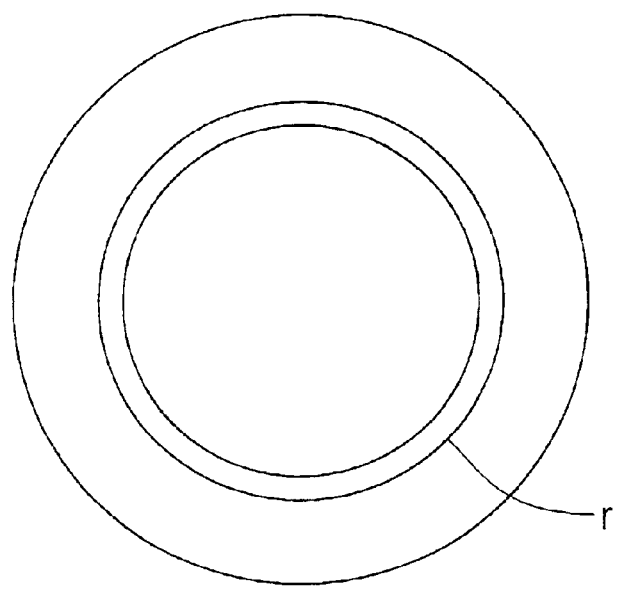 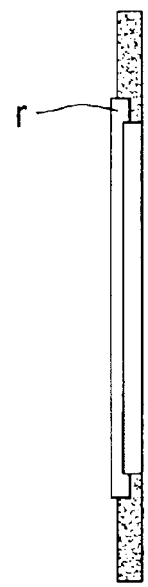
Fig. 1A    Fig. 1B
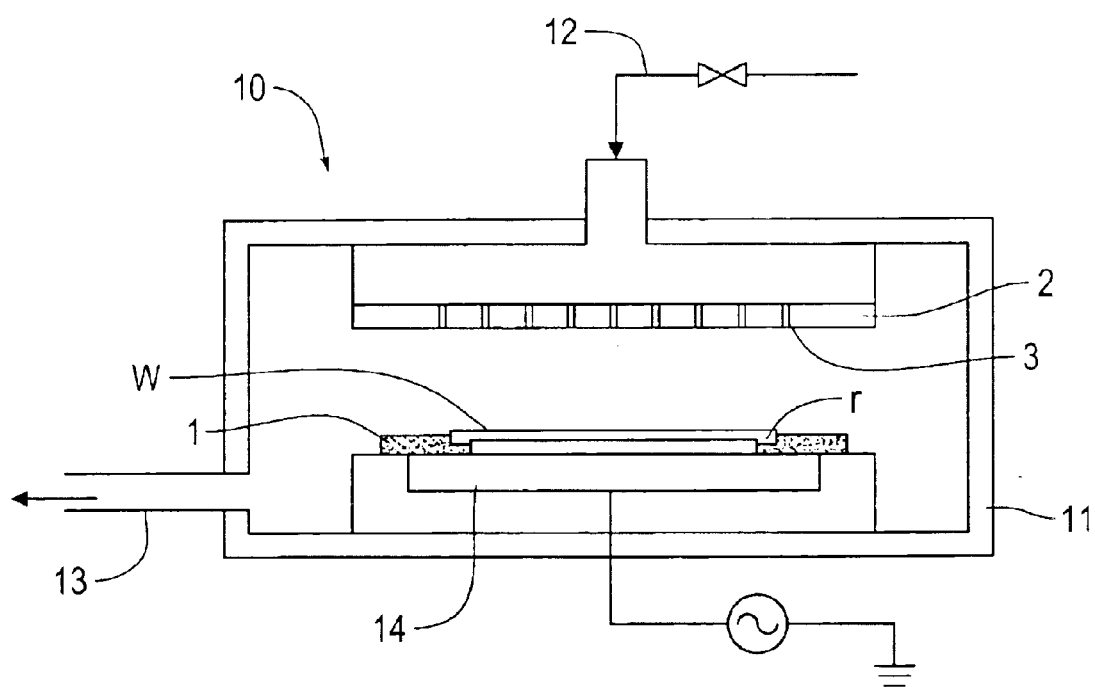
Fig. 2

SILICON FOCUS RING AND METHOD FOR PRODUCING THE SAME

BACKGROUND OF THE INVENTION

1. Field of the Invention

The present invention relates to a silicon focus ring for a plasma etching, for example, used for a dry etching apparatus used in a fabrication process of a semiconductor device.

2. Description of the Related Art

For example, in fabrication of such as a semiconductor device, apparatuses utilizing plasma are mostly used when a silicon wafer is formed thin film or etched. Among such apparatuses, for example, when a parallel plate plasma apparatus is used, a silicon wafer to be treated is placed on a lower electrode side, a reaction gas is distributed from an upper electrode side, which is parallel to the lower electrode, and high frequency plasma is generated by applying high frequency voltage to both electrodes, so that the silicon wafer can be etched.

As for such a plasma apparatus, in order to maintain even characteristics of a semiconductor device to be fabricated on the surface of a silicon wafer, plasma supplied to a silicon wafer has to be uniformed. Therefore, it has been conventionally devised that a circular part what is called focus ring is placed around a wafer. For example, it has been performed that since a focus ring consisting of a conductor such as graphite is placed, plasma is extended to outside of the wafer so as to improve uniformity of plasma applied to the wafer. However, this focus ring itself is also etched by plasma while the silicon wafer is etched.

Conventionally, a focus ring has been made of high purified graphite material, which has conductivity, high chemical stability, and low influence to contaminate a silicon wafer with metallic impurities. However, the graphite material is complex of particles consisting of aggregate and matrix, there may be problems such that constitutive particles are scattered and consumed due to plasma etching, and the particles fall on a silicon wafer to be treated, which may lead to trouble in formation of circuit pattern. To solve these problems, glassy carbon has been used for focus ring material recently.

However, even if the glassy carbon is used for the focus ring, the silicon wafer can not be prevented from contamination. In fabrication of a semiconductor device, contamination of a silicon wafer may cause to degrade its characteristics and lower device yield. Accordingly, it has been proposed that material of a focus ring is replaced glassy carbon causing contamination with single crystal silicon, which is the same material as a silicon wafer.

However, even if a focus ring is made of single crystal silicon with high purity as a whole, it is inevitable in forming process of a single crystal silicon plate sliced from a single crystal silicon ingot that impurities generating from a processing apparatus adhere to the surface of a focus ring when machining cut or polishing process is performed. These impurities are also generated from such as materials or tools used in each of processing apparatus, and they are mainly heavy metal. Even a small amount of such impurities cause a serious problem in fabrication process of a semiconductor device. That is, if the focus ring to which impurities adhere is used continuously, there is a problem that these impurities float and fall onto a silicon wafer, and cause to lower the yield in a semiconductor device fabricated on a silicon wafer. Also, the focus ring may be contaminated by a small amount of such as heavy metal in a plasma etching process itself.

Moreover, there is a problem that these impurities of heavy metal adhering a focus ring not only adhere to the surface of the focus ring but also diffuse inside the focus ring, so that defects are generated. Such impurities of heavy metal can be confirmed as pits by breaking a focus ring to which impurities are adhered, subjecting its broken section to such as Secco etching, and observing it under a microscope. These defects due to such impurities cause to generate particles on a focus ring and to lower a life.

SUMMARY OF THE INVENTION

The present invention has been accomplished to solve the above-mentioned problems, and an object of the present invention is to provide a silicon focus ring consisting of single crystal silicon used as a focus ring in a plasma apparatus wherein disadvantages due to impurities of such as heavy metal can be prevented.

To achieve the above-mentioned object, the present invention provides a focus ring consisting of single crystal silicon used as a focus ring in a plasma apparatus wherein concentration of interstitial oxygen in a silicon focus ring is not less than $5 \times 10^{17}$ atoms/cm$^3$ and not more than $1.5 \times 10^{18}$ atoms/cm$^3$.

As described above, when such a silicon focus ring of which interstitial oxygen concentration is not less than $5 \times 10^{17}$ atoms/cm$^3$ and not more than $1.5 \times 10^{18}$ atoms/cm$^3$ is used as a focus ring in a plasma apparatus, for example, a sufficient amount of oxygen precipitation is generated in a bulk portion of a focus ring at a high temperature, the effect, which can capture impurities such as heavy metal adhered to a silicon focus ring, what is called, intrinsic gettering effect (IG effect), can be obtained sufficiently. Therefore, the focus ring has gettering effect, and disadvantage such that impurities adhered to the focus ring fall on a silicon-wafer to be treated can be prevented. Moreover, defects due to such impurities on the surface portion of the silicon focus ring can be suppressed by the gettering effect, as the result of this, generation of particles on the focus ring surface can be reduced. Furthermore, if oxygen concentration is in the aforementioned range, defects due to oxygen precipitation such as OSF (oxidation induced staking fault) are not generated by excessive oxide precipitation during use of the focus ring, and as the result of this, generation of roughness causing particles on the focus ring surface can be prevented.

It is desirable that nitrogen concentration in the silicon focus ring is not less than $5 \times 10^{13}$ number/cm$^3$ and not more than $5 \times 10^{15}$ number/cm$^3$.

As described above, if nitrogen concentration in the silicon focus ring is not less than $5 \times 10^{13}$ number/cm$^3$ and not more than $5 \times 10^{15}$ number/cm$^3$, oxygen precipitation in a bulk portion of the silicon focus ring is promoted sufficiently, and gettering effect can be more effective.

Further, it is desirable that the surface of the silicon focus ring is subjected to etching treatment.

As described above, if the surface of the silicon focus ring is subjected to etching treatment, mechanical damage layer generated in forming process of a silicon focus ring can be eliminated, generation of particles can be reduced, and there are few adhered heavy metal.

Also, the present invention provides a producing method for a silicon focus ring used for a plasma apparatus, wherein a single crystal silicon wherein concentration of interstitial oxygen is not less than $5 \times 10^{17}$ atoms/cm$^3$ and not more than $1.5 \times 10^{18}$ atoms/cm$^3$ is grown by a Czochralski method, the single crystal silicon is processed in a circle, and a silicon focus ring is produced.

As described above, in the producing method for a silicon focus ring, the single crystal silicon having predetermined concentration of interstitial oxygen is grown by a Czochralski method, the single crystal silicon is processed in a circle, and the silicon focus ring is produced. As the result of this, the silicon focus ring, which can be prevented disadvantages due to impurities such as heavy metal by a simple method, can be produced.

In this case, it is desirable that a single crystal silicon is grown by a Czochralski method with doping nitrogen, so that nitrogen concentration of the silicon is not less than $5 \times 10^{13}$ number/cm$^3$ and not more than $5 \times 10^{15}$ number/cm$^3$.

It is because gettering effect of a silicon focus ring to be produced is higher, and disadvantages due to impurities such as heavy metal can be prevented.

As described above, according to the present invention, since concentration of interstitial oxygen contained in a silicon focus ring consisting of silicon single crystal used as a focus ring in a plasma apparatus is not less than $5 \times 10^{17}$ atoms/cm$^3$ and not more than $1.5 \times 10^{18}$ atoms/cm$^3$, sufficient gettering effect can be afforded to the silicon focus ring. Accordingly, disadvantages due to impurities such as heavy metal can be prevented, and the yield in fabrication of a semiconductor device can be improved.

BRIEF DESCRIPTION OF THE DRAWINGS

FIG. 1 is an explanatory view of one example of the silicon focus ring according to the present invention, (a) is its plane view and (b) is its vertical section;

FIG. 2 is an explanatory view of one example of a plasma apparatus in which the silicon focus ring according to the present invention is used.

DESCRIPTION OF THE INVENTION AND A PREFERRED EMBODIMENT

The present invention will be further described below in detail.

The present inventors have found that in a silicon focus ring consisting of silicon single crystal used as a focus ring in a plasma apparatus of the present invention, if optimum concentration of interstitial oxygen contained in the silicon focus ring is chosen, sufficient gettering effect can be achieved in the silicon focus ring, and disadvantages caused by adhesion of impurities such as heavy metal to the silicon focus ring can be prevented, and have studied various conditions further to complete the present invention.

Namely, when a silicon focus ring containing a suitable amount of interstitial-oxygen is used for a plasma apparatus, the temperature of the silicon focus ring becomes high, since it is in contact with plasma. Then, interstitial oxygen contained therein is precipitated to form precipitates, and a gettering effect can be achieved. Impurities such as heavy metal adhered to the silicon focus ring and defects in the surface portion of the focus ring are captured by gettering sinks in a bulk portion of the silicon focus ring. As a result of this, particles generated on the surface of the focus ring can be reduced.

Conventionally, it has been known that an oxygen precipitation induced bulk fault due to interstitial oxygen can be an effective gettering sink in intrinsic gettering. The inventors of the present invention have thought of possibility of applying gettering used in fabrication process of a device to a silicon focus ring in a plasma apparatus, and made a lot of experiments and investigated as for a relation between concentration of interstitial oxygen and gettering effect.

As a result of this, it has been found that, if concentration of interstitial oxygen in a silicon focus ring is not less than $5 \times 10^{17}$ atoms/cm$^3$, oxygen precipitates are generated when the focus ring is used, and sufficient gettering effect can be achieved. However, if concentration of interstitial oxygen is more than $1.5 \times 10^{18}$ atoms/cm$^3$, defects due to oxygen precipitation such as OSF (oxidation induced stacked fault) are sometimes generated, which may lead to roughening surface of the silicon focus ring. Accordingly, concentration of interstitial oxygen of the silicon focus ring should be not more than $1.5 \times 10^{18}$ atoms/cm$^3$.

Furthermore, it has been known that nitrogen number in the silicon single crystal has an effect of increasing oxygen precipitation (for example, F. Shimura and R. S. Hockett, Appl. Phys. Lett. 48, 224, 1986). Accordingly, the inventors of the present invention have thought of achieving more effective gettering effect by allowing the silicon focus ring to contain an adequate amount of nitrogen so as to increase oxygen precipitation in a bulk portion of the silicon focus ring.

The inventors also made experiments and investigation as for a relation between nitrogen concentration in a silicon focus ring and a gettering effect, and found that if nitrogen concentration in the silicon focus ring is not less than $5 \times 10^{13}$ number/cm$^3$, a sufficient effect of increasing oxygen precipitation can be achieved, and more effective gettering effect can be achieved. However, it was also found that in the case when nitrogen concentration was not less than $5 \times 10^{15}$ number/cm$^3$, an excessive oxygen precipitation caused to generate a lot of defects due to oxygen precipitation such as OSF, so that surface of the silicon focus ring might become rough. Furthermore, if nitrogen concentration is not less than $5 \times 10^{15}$ number/cm$^3$, which is solid solubility limit in a silicon single crystal, monocrystallization of the silicon single crystal itself may be inhibited during growth of the silicon single crystal constituting the focus ring according to such as a Czochralski method. Accordingly, the inventors defined more preferable nitrogen concentration in the silicon focus ring to be not less than $5 \times 10^{13}$ number/cm$^3$ and not more than $5 \times 10^{15}$ number/cm$^3$. The present invention has been accomplished by further studying on the basis of the findings described above.

Embodiments of the present invention will now be described. However, the present invention is not limited thereto.

Concentration of interstitial oxygen of the present invention contained in the silicon focus ring should be in the range of not less than $5 \times 10^{17}$ atoms/cm$^3$ and not more than $1.5 \times 10^{18}$ atoms/cm$^3$. Such concentration of interstitial oxygen can be achieved by the following method.

When a silicon single crystal ingot constituting a silicon focus ring of the present invention is pulled according to a Czochralski method, a polycrystalline silicon as raw material is first molten to prepare a silicon melt. Such a silicon is generally molten in a quartz crucible. In this case, when the silicon is molten in the quartz crucible, the surface of the quartz crucible in contact with the silicon melt is molten into the silicon melt, and oxygen is mixed with the silicon melt. By adjusting the number of rotation of the crucible while the ingot is pulled from the silicon melt, an amount of oxygen, which is molten and mixed into the silicon melt, can be controlled, and concentration of interstitial oxygen in the silicon single crystal can be easily controlled.

The oxygen concentration can also be easily controlled to be in the above-mentioned range by increasing or decreasing gas volume flowing into a chamber, increasing or lowering an atmosphere pressure, controlling temperature distribution and convection of a silicon melt in a crucible or the like.

It is also desirable that nitrogen concentration contained in the silicon focus ring of the present invention is in the range of not less than $5\times10^{13}$ number/cm$^3$ and not more than $5\times10^{15}$ number/cm$^3$. Nitrogen can be introduced into the crystal by such as forming a nitride film on a silicon wafer according to CVD method or the like, placing the silicon wafer having the nitride film in a quartz crucible together with a polycrystalline silicon as raw material, and melting them. In the case, a nitrogen concentration can be controlled to be in the above-mentioned range by adequately controlling an amount of the nitride film on the silicon wafer to be added in the raw material. Accordingly, nitrogen concentration of the focus ring can be controlled quite accurately.

Nitrogen can also be doped in the silicon single crystal to be pulled by adding nitride itself in a silicon melt, using atmosphere gas containing nitrogen, or doing the like. In these cases, a doping amount of nitrogen in the silicon single crystal can be adjusted by controlling such as an amount of nitride, concentration or introduction time of nitrogen gas.

As described above, a silicon single crystal ingot having a desired interstitial oxygen concentration and nitrogen concentration can be produced.

The silicon single crystal ingot produced as described above is sliced to have a desired thickness, and subjected to optimal processes adequately selected from such as forming process of machining inner and outer periphery and polishing process of polishing the surface, so as to produce a silicon focus ring consisting of silicon single crystal.

In that case, it is desirable that the surface of the silicon focus ring is subjected to etching treatment. It is because a work damage layer sometimes remains on the surface of the silicon focus ring during fabrication process of machining inner and outer periphery, surface polishing or the like, which may lead to generate particles on the surface of the silicon focus ring, and the particles may adhere to the silicon wafer to be treated.

Accordingly, the work damage layer remaining on the surface of the focus ring can be removed by etching the surface of the silicon focus ring. Any type of etching treatment such as acid etching or alkali etching can be conducted, as far as the surface of the silicon focus ring can be etched. Furthermore, in a fabrication process of the silicon focus ring, it is more preferable that cleaning using such as acid etching or alkali etching is appropriately conducted to remove impurities adhered to its surface. Specifically, a mixed acid such as HF+HNO$_3$+CH$_3$COOH, an aqueous solution of NaOH, KOH or the like can be used.

As described above, the silicon focus ring of the present invention can be obtained. The silicon focus ring is, for example, a silicon focus ring 1 consisting of silicon single crystal as shown in FIG. 1. A bump portion "r" is formed at an inner periphery portion of the silicon focus ring 1 to place a silicon wafer.

Such a silicon focus ring 1 of the present invention is used with being mounted to a plasma apparatus 10 as shown in FIG. 2. The plasma apparatus 10 comprises a chamber 11 to which a gas feed system 12 and a gas exhaust system 13 are connected, and an upper electrode 2 which is installed in the chamber 11. A reaction gas supplied from the gas feed system 12 is emitted downward of the upper electrode 2 through gas flowing holes 3. A silicon focus ring 1 facing the upper electrode 2 is connected to a high frequency power supply via a lower electrode 14.

Then, the silicon wafer W to be treated is loaded on the silicon focus ring 1 to which high frequency electric power is applied, and a surface of the silicon wafer W is etched by plasma discharge generated between the upper electrode 2 and the silicon focus ring 1 facing it.

During the above-mentioned etching treatment, the silicon focus ring 1 of the present invention has a sufficient gettering effect, since its interstitial oxygen concentration is in a suitable value. Accordingly, even if impurities such as heavy metal adhere to the surface during productive processing steps, or inside of the plasma apparatus is contaminated with heavy metal, impurities such as heavy metal can be captured into the bulk portion of the focus ring 1. Accordingly, disadvantage such as contamination caused by fall of impurities onto the silicon wafer can be prevented.

Furthermore, the silicon focus ring 1 of the present invention can also prevent defects in the surface portion of the silicon focus ring. Accordingly, even if the silicon focus ring 1 is used continuously for a long time, the surface of the focus ring 1 can be prevented from generating particles. Accordingly, giving particles from the focus ring 1 to the silicon wafer can also be prevented.

EXAMPLE

Examples and Comparative examples will be explained below. (Examples 1 to 4, Comparative Examples 1 to 4)

The silicon focus ring as shown in FIGS. 1(a) and (b) was produced by the following method.

In accordance with CZ method, polycrystalline silicon of raw material was charged into a quartz crucible having a diameter of 36 inches, and eight single crystal ingots of P type and 0.1 Ω· cm having a diameter of 10 inches were pulled. Any of crystals were pulled with varying oxygen concentration in the single crystal by controlling the number of rotation of the crucible during pulling. Any of crystals were also pulled with varying nitrogen concentration in the single crystal by charging the silicon wafer having silicon nitride film of which thickness are different from each other in advance into the raw material.

The eight silicon single crystal ingots having a diameter of about 270 mm pulled as described above were subjected to a cylindrical grinding. Subsequently, the focus ring material having a thickness of 4 mm was sliced therefrom, and its inner and outer peripheral portion were grinded to produce a material having an outer diameter of 260 mm and an inner diameter of 200 mm. A bump "r" for placing a silicon wafer was formed at an inner peripheral portion of the focus ring material. Then, the surface of the silicon focus ring was etched with HF+HNO$_3$+CH$_3$COOH to remove the work damage layer generated during processing.

Eight kinds of the silicon focus rings thus obtained were mounted in the plasma apparatus as shown in FIG. 2, and a silicon wafer was subjected to dry etching. Each state of contamination of the silicon wafer after the etching and surface roughness of the silicon focus ring after being used were evaluated.

The results of the measurement were shown in Table 1.

TABLE 1

| | Interstitial oxygen concentration (atoms/cm$^3$) | Nitrogen concentration (number/cm$^3$) | State of contamination in Wafer | State of roughness of surface of silicon focus ring |
|---|---|---|---|---|
| Example 1 | $5.0 \times 10^{17}$ | $1.0 \times 10^{13}$ | ○ | ○ |
| Example 2 | $1.5 \times 10^{18}$ | $1.0 \times 10^{13}$ | ○ | ○ |
| Example 3 | $5.0 \times 10^{17}$ | $5.0 \times 10^{13}$ | ⊚ | ⊚ |
| Example 4 | $1.5 \times 10^{18}$ | $5.0 \times 10^{15}$ | ⊚ | ⊚ |
| Comparative Example 1 | $4.9 \times 10^{17}$ | $1.0 \times 10^{13}$ | X | X |
| Comparative Example 2 | $1.6 \times 10^{18}$ | $1.0 \times 10^{13}$ | Δ | X |
| Comparative Example 3 | $4.9 \times 10^{17}$ | $4.9 \times 10^{13}$ | X | X |
| Comparative Example 4 | $1.6 \times 10^{18}$ | $5.1 \times 10^{15}$ | Δ | X |

In Table 1, Examples 1 to 4 show results of etching using the silicon focus rings of the present invention. Comparative examples 1 to 4 show results in the case that the silicon focus rings wherein concentration of oxygen or nitrogen were not in the range of the present invention was used. Evaluation of the state of wafer contamination in Table 1 was conducted on the basis of the following criterion. As for preventive effect of contamination of the silicon focus ring, X represents quite large one in wafer contamination, Δ represents large one, ○ represents so small one that there is no problem and ⊚ represents almost no influence. As for degree of generation of surface roughness on the surface of the silicon focus ring, X represents quite large one in surface roughness, Δ represents large one, ○ represents so small one that there is no problem, and ⊚ represents almost no surface roughness.

As shown in Table 1, when the silicon focus ring of the present invention wherein concentration of interstitial oxygen contained in the silicon focus ring is not less than $5 \times 10^{17}$ atoms/cm$^3$ and not more than $1.5 \times 10^{18}$ atoms/cm$^3$ is used as in Examples.1 to 4, contamination of the silicon wafer to be treated can be reduced, and surface roughness of the surface of the silicon focus ring can be also reduced. Namely, particles generated from a defect portion of the surface can be reduced.

Especially, when a silicon focus ring contains a sufficient amount of nitrogen as shown in Example 3 and Example 4, contamination of the wafer and surface roughness of the surface of the silicon focus ring can be further reduced.

On the contrary, as shown in Comparative examples 1 to 4, it is apparent that the silicon focus ring, which is out of the range of the present invention, can not give the preventive effect of contamination to the wafer. Also, since the surface of the silicon focus ring was badly roughed, it is expected that particles due to surface defects were much generated.

The present invention is not limited to the above-described embodiments. The above-described embodiments are mere examples, and those having substantially the same structure as that described in the appended claims and providing the similar action and effects are included in the scope of the present invention.

What is claimed is:

1. A silicon focus ring comprising silicon single crystal used as a focus ring in a plasma apparatus, wherein, in order to produce an intrinsic heavy metal gettering effect of the focus ring, a concentration of interstitial oxygen contained in the silicon focus ring is not less than $5 \times 10^{17}$ atoms/cm$^3$ and not more than $1.5 \times 10^{18}$ atoms/cm$^3$, and a nitrogen concentration in the silicon focus ring is not less than $5 \times 10^{13}$ number/cm$^3$ and not more than $5 \times 10^{15}$ number/cm$^3$, the intrinsic gettering effect exceeding a corresponding effect for silicon not doped with interstitial oxygen and nitrogen, and the surface of the silicon focus ring is subjected to etching treatment to remove a mechanical damage layer.

2. A producing method for a silicon focus ring of a single crystal silicon used for a plasma apparatus, wherein, in order to produce an intrinsic heavy-metal gettering effect of the focus ring, a concentration of interstitial oxygen contained in the silicon focus ring is not less than $5 \times 10^{17}$ atoms/cm$^3$ and not more than $1.5 \times 10^{18}$ atoms/cm$^3$, the single crystal silicon is grown by a Czochralski method with doping nitrogen, a nitrogen concentration in the silicon focus ring is not less than $5 \times 10^{13}$ number/cm$^3$ and not more than $5 \times 10^{15}$ number/cm$^3$, the single crystal silicon is processed in a circle, and a silicon ring is produced, and the surface of the silicon focus ring is subjected to etching treatment to remove a mechanical damage layer, the intrinsic gettering effect exceeding a corresponding effect for silicon not doped with interstitial oxygen and nitrogen.

* * * * *